(12) United States Patent
Kim et al.

(10) Patent No.: US 6,594,818 B2
(45) Date of Patent: Jul. 15, 2003

(54) MEMORY ARCHITECTURE PERMITTING SELECTION OF STORAGE DENSITY AFTER FABRICATION OF ACTIVE CIRCUITRY

(75) Inventors: Su-Chul Kim, Anyang (KR); Hyun-Geun Byun, Sungnam (KR); Kwang-Jin Lee, Seoul (KR); Jong-Cheol Lee, Seoul (KR); Uk-Rae Cho, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 71 days.

(21) Appl. No.: 09/814,565

(22) Filed: Mar. 21, 2001

(65) Prior Publication Data

US 2002/0136046 A1 Sep. 26, 2002

(51) Int. Cl.[7] .............................................. G06F 17/50
(52) U.S. Cl. ........................... 716/19; 365/63; 365/154; 365/230.01; 365/230.08; 365/185.08; 365/185.11; 365/185.28; 365/200; 365/201
(58) Field of Search ........................ 716/1–21; 257/202, 257/296, 668; 365/154, 185.08, 185.11, 185.28, 189.08, 200, 201, 230.01, 230.03, 230.08, 63; 714/755

(56) References Cited

U.S. PATENT DOCUMENTS

| 5,208,782 A | * | 5/1993 | Sakuta et al. .......... 365/230.03 |
| 5,801,406 A | * | 9/1998 | Lubow et al. .............. 257/202 |

* cited by examiner

*Primary Examiner*—Vuthe Siek
*Assistant Examiner*—Helen B Rossoshek
(74) *Attorney, Agent, or Firm*—John A. Castellano; Harness, Dickey & Pierce, P.L.C.

(57) ABSTRACT

A generic wafer includes memory units separated by scribe lanes. Memory chips of different storage capacities can be produced from different numbers of memory units on the generic wafer by forming one or more interconnect layer specialized according to a desired storage capacity and cutting the wafer using a sawing pattern according to the desired storage capacity. The specialized layer can be formed using different masks sets that form a different conductive pattern for each storage capacity or forming a generic interconnect structure with fuses that are cut to select the storage capacity of the memory chips

26 Claims, 12 Drawing Sheets

MEMORY ARCHITECTURE PERMITTING SELECTION OF STORAGE DENSITY AFTER FABRICATION OF ACTIVE CIRCUITRY

FIELD OF THE INVENTION

This invention relates to semiconductor memories and to the manufacture of semiconductor memories.

DESCRIPTION OF RELATED ART

Manufacturers of integrated circuit (IC) memory devices such as dynamic random access memory (DRAM), static random access memory (SRAM), and flash memory typically provide different products having different sizes (i.e., different storage capacities). Each memory product generally requires separate development, a unique mask set, and a different manufacturing process. Changing a manufacturing facility from manufacturing one size of memory device to another size of memory device can be time consuming because the mask set and process parameters must be changed. The time required for these changes can reduce manufacturing efficiency and increase the cost of the memory devices. Additionally, the manufacturer of IC memory devices often needs to accurately judge the demand for memory devices of the different sizes. Otherwise, the manufacturer has inventory problems when the demand for memory devices shifts and the manufacturer has too many memory devices of one size and too few of another size.

U.S. Pat. No. 5,801,406 describes a programmable gate array (PGA) architecture that permits manufacture of gate arrays of different sizes on a single wafer. The PGA architecture includes arrays that can be used alone for small devices or combined with other gate arrays on the same wafer to create larger devices. This permits simultaneous manufacture of gate arrays of different sizes and avoids the down time associated with changing mask sets for separate manufacture of different sizes of gate array devices. The ability to combine different numbers of underlying arrays in different devices allows flexibility in the product mix resulting from the fabrication process. However, such techniques have not been used for memory because input/output requirements of memory, for example, for address, data, and clock signals differ from the input/output requirements of gate arrays, and efficient methods for combining memory units on a wafer have not been known. Accordingly, achieving similar efficiencies in the production of memory devices requires further advances.

SUMMARY

The present invention provides methods and structures for manufacturing memory chips of different sizes on a single wafer or using the same masks and processing steps to generate a generic wafer that is adaptable to produce memory chips having a size selected in the final stages of wafer processing. When the generic wafers are fabricated, generic layers form a plurality of memory units. The memory units include memory arrays and peripheral circuitry such as input/output (I/O) circuits, control circuits, decoders, address and data buffers, and/or other peripheral circuits needed in an integrated circuit memory device. In one embodiment, each memory unit alone is not complete but is combined with one or more memory unit to form an IC memory chip. Scribe lanes between the memory units can be left free of active circuitry or may include connecting circuitry between the memory units. Generally, the desired storage capacity of each memory chip determines the area of each chip and whether the wafer will be cut along a scribe lane or the scribe lane will contain connecting circuitry.

When demand requires memory devices of a specific storage capacity, specialized layers, which typically implement electrical interconnections, are fabricated over the generic layers to achieve the demanded storage capacity. The specialized layers interconnect the appropriate number of memory units to function as a single IC memory device. The specialized layers can also disable operation of selected circuit blocks that lie within the area of a chip when the circuit blocks are not required to implement the demanded storage capacity.

One embodiment of the invention is a wafer that includes a plurality of memory units that are separated by the scribe lanes. The memory units are such that forming a first conductive structure on a first set of the memory units and cutting the wafer along the scribe lanes surrounding the first set of memory units forms a complete first memory chip having a first storage capacity. Alternatively, forming a second conductive structure on a second set of the memory units and cutting the wafer along the scribe lanes surrounding the second set of memory units forms a complete second memory chip having a second storage capacity that differs the first storage capacity. Generally, the wafer includes all active circuit elements required for the first or second memory chip, and the conductive structures cross at least one of the scribe lanes to connect active circuit elements in one memory unit to active circuit elements in another memory unit.

The first conductive structure can include a conductive pattern formed with a first mask, while the second conductive structure includes a conductive pattern formed with a second mask.

In one specific embodiment, a fuse structure is connected to the memory units. Forming the first conductive structure in this embodiment includes implementing a first fuse option in the fuse structure. Forming the second conductive structure includes implementing a second fuse option in the fuse structure. Generally, the fuse structure extends across one or more of the scribe lanes to thereby interconnect two or more of the memory units.

Each memory units generally includes memory cores and peripheral circuits, but different memory units can include different peripheral circuits so that when the memory units are used in combination there is less redundancy and so that bonding pad patterns for the different size memory chips are similar. When redundant peripheral circuits are present on the same chip, some of the redundant circuits can be disconnected or otherwise disabled.

The wafer is cut according to the desired size or sizes of memory chips, and each memory chip typically includes an intact scribe lane. Additionally, a larger capacity memory chip can have an edge that would have been inside a smaller memory chip. In particular, such relative positioning of boundaries permits different size memory chips that have similar bonding pad configurations.

Another embodiment of the invention is a memory chip. The memory chip includes a semiconductor substrate and a plurality of generic layers disposed on the semiconductor substrate to form first and second memory units. An interconnect structure connects the first memory unit to the second memory unit and crosses a scribe lane that is intact within the memory chip. The scribe lane corresponds to a region of the substrate and the plurality of layers that lacks active circuit elements and has a width sufficient for a wafer cutting process that separated the integrated memory circuit chip from other integrated memory chips formed in a wafer. The memory chip can further include additional memory units and additional scribe lanes between the memory units.

The memory units in the memory chip may be of two different types. Both types including memory storage arrays, but the different types of memory units include different peripheral circuitry. For example, each of X address buffers, Y address buffer, clock buffers, and control signal buffer may only be implemented in one type of memory unit. The interconnect structure can disable redundant peripheral circuitry.

Another embodiment of the invention is an integrated circuit memory chip including a semiconductor substrate and a plurality of generic layers disposed on the semiconductor substrate to form a first memory unit group and a second memory unit group. Each memory unit group can contain one or more memory units. The first memory unit group includes a first structure such as an address buffer, clock buffer, or control signal buffer that is identical to a second structure in the second memory unit. An interconnect structure that connects the first memory unit group to the second memory unit group disables the first structure in the first memory unit group and enables the second structure in the second memory unit group. Similarly, the first memory unit group may further include a third structure that is identical to a fourth structure in the second memory unit, and the interconnect structure can enable the third structure in the first memory unit group and disable the fourth structure in the second memory unit group. Accordingly, redundant circuitry, which is used when manufacturing smaller capacity memory chips, is disabled for larger capacity memory chips, which contain more memory units.

Another embodiment of the invention is a method for manufacturing an integrated circuit memory. One such method includes processing a wafer to form a plurality of memory units, forming a conductive structure on the memory units, and separating the wafer into memory chips. The conductive structure corresponds to a desired storage capacity and is one of a plurality of alternative conductive structures for the memory units, each of the alternative conductive structures corresponding to a different one of the plurality of storage densities. The sawing pattern for the separation corresponds to the desired storage capacity and is one of a plurality of alternative sawing patterns, each of the alternative sawing patterns corresponding to a different one of the plurality of storage densities.

One very specific embodiment includes a row of memory units separated by a sequence of scribe lanes. In this embodiment, a first of the alternative sawing pattern cuts along every other one of the scribe lanes beginning with a scribe lane that is first in the sequence. A second of the alternative sawing patterns cuts along every fourth of the scribe lanes beginning with a scribe lane that is second in the sequence.

BRIEF DESCRIPTION OF THE DRAWINGS

Use of the same reference symbols in different figures indicates similar or identical items.

DETAILED DESCRIPTION

In accordance with an aspect of the invention, a process for manufacturing integrated circuit memory chips produces a nearly completed wafer that can be finished to produce memory chips of any of a set of different storage capacities. In general, the wafer includes memory units that are adaptable for combination and use in memory chips of different capacities. In an exemplary embodiment, the nearly completed wafer includes all integrated circuit elements except final interconnect structures that are typically formed in one or more patterned metal layer. One or more of these interconnect structures cross scribe lanes that are uncut during separation of integrated circuit chips. A sawing pattern for separation of the wafer into separate integrated circuit chips is according to the desired storage capacity of memory chips.

Figure 1:
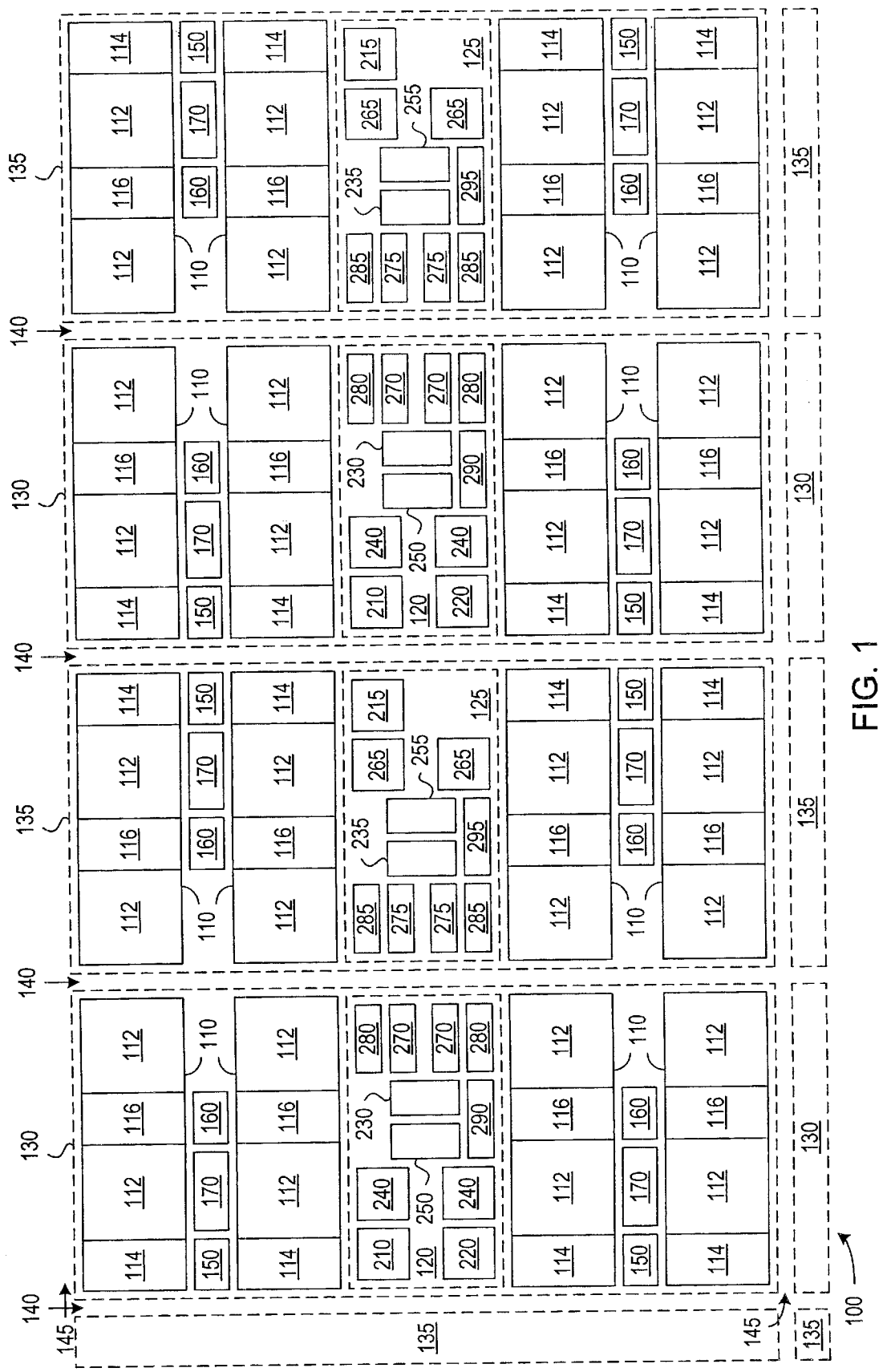
FIG. 1 shows a portion of a semiconductor wafer after fabrication forms generic layers that can be used in integrated circuit memory devices having different storage capacities.

FIG. 1 shows a portion of the layout a generic wafer 100 in accordance with an exemplary embodiment of the invention. Generic wafer 100 includes an array of memory units 130 and 135 that are separated by vertical and horizontal scribe lanes 140 and 145. Each memory unit 130 or 135 includes memory cores 110, peripheral circuits 120 or 125, X address drivers 150, Y address drivers 160, and data drivers 170. As described further below, a single memory unit 130 or 135 alone does not contain all of the circuitry need for a complete memory chip. Accordingly, each memory chip eventually formed from generic wafer 100 contains two or more memory units 130 and 135.

Each memory core 110 contains one or more array 112 of memory cells such as DRAM, SRAM, or Flash memory cells. Such conventional memory arrays include row lines (sometime referred to as word lines) and column lines (sometime referred to as bit lines), which connect to the memory cells in the array. Each memory core 110 also contains a main row decoder (MRD) 114, row driver circuits 116, a main column decoder (not shown), and column drivers (not shown).

Figure 2A:
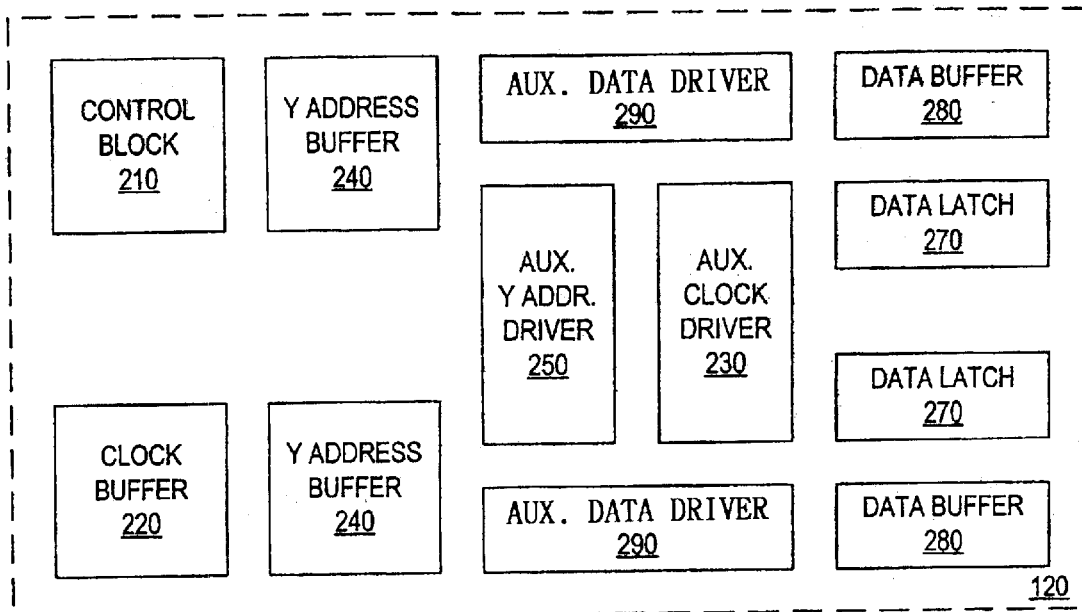
FIGS. 2A and 2B are block diagrams of peripheral circuits in memory units on the wafer of FIG. 1.
Figure 2B:
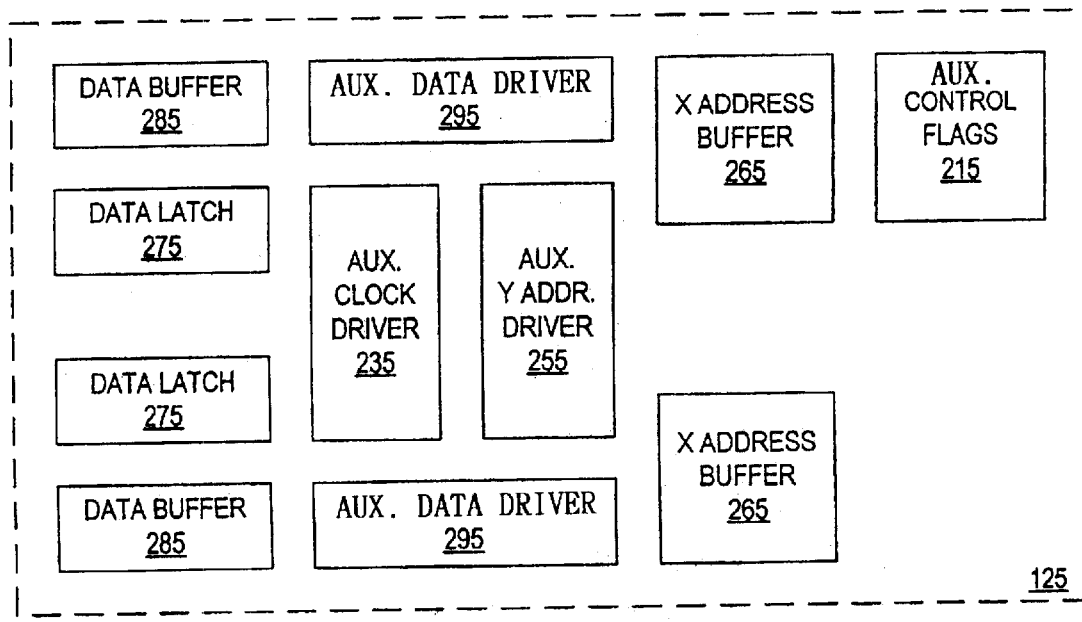

The peripheral circuits 120 and 125 for the respective memory units 130 and 135 differ from each other. FIGS. 2A and 2B are block diagrams illustrating circuit blocks in peripheral circuits 120 and 125, respectively. As shown in FIG. 2A, each peripheral circuit 120 contains a control block 210, a clock buffer 220, an auxiliary clock driver 230, Y address buffers 240, an auxiliary Y address driver 250, data latches 270, data buffers 280, and auxiliary data drivers 290. Referring to FIG. 2B, each peripheral circuit 125 contains auxiliary control flags 215, a clock driver 235, an auxiliary Y address driver 255, X address buffers 265, data latches 275, data buffers 285, and auxiliary data drivers 295.

Control block 210, clock buffer 220, Y address buffers 240, X address buffers 265, and data buffers 280 and 285 are for signal input and/or output and respectively handle control signals, a clock signal, Y address signals, X address signals, and data signals. Such I/O buffers and circuits are well known in the art and can be of a conventional design according to the type of memory device, e.g., DRAM, SRAM, or Flash memory, being produced. As described further below, some of these I/O circuits in particular peripheral circuits 120 or 125 are unused for particular selections of the storage capacity of memory chips formed from wafer 100.

Referring again to FIG. 1, an exemplary embodiment of generic wafer 100 contains circuit blocks for manufacture of synchronous dynamic random access memory (SDRAM) devices. Currently, the integrated circuit structure of a typical SDRAM device includes about 25 layers or implantation steps. In accordance with the exemplary embodiment, generic wafer 100 includes about 90% or more (e.g., about 22) of the layers required for fabrication of SDRAMs. Completing fabrication of the SDRAM chips from wafer 100 requires adding one or more specializes layers that form structures (typically interconnect layers and/or bonding pads layers) that are specific to the capacity desired for the memory chips formed from wafer 100.

A fabrication process in accordance with one embodiment of the invention forms all of the generic layers to produce generic wafers 100. The generic wafers 100 are subsequently processed according to the demand for memory chips of a particular storage capacity. The further processing of generic wafer 100 includes forming specialized layers that depend on the desired storage capacity, cutting the finished wafer along selected scribe lanes 140 and 145 to produce memory chips, and packaging the memory chips.

The specialized layers and the sawing pattern for generic wafer 100 determine the storage capacity of the resulting memory devices. This allows a memory manufacturer to set aside generic wafers 100 having only the generic layers until the memory manufacturer receives an order for memory chips of a certain capacity. Accordingly, the memory manufacturer is not stuck with an inventory of memory chips having a size currently disfavored in the market.

Figure 3A:
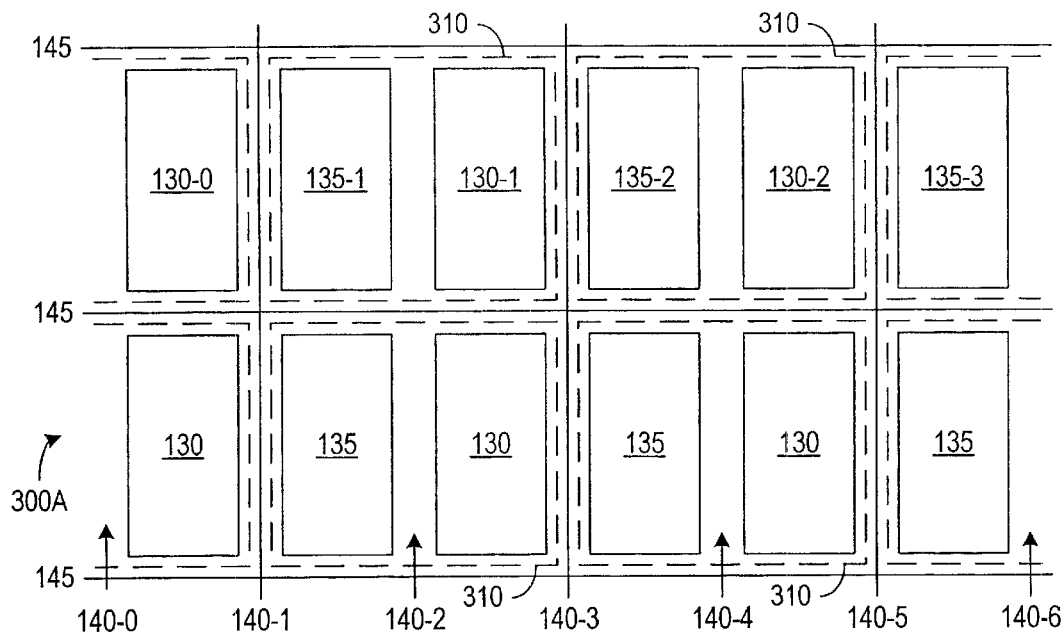
FIGS. 3A and 3B illustrate alternative cutting patters for respectively forming 1x and 2x memory chips from a finished wafers fabricated from the wafer of FIG. 1.
Figure 3B:
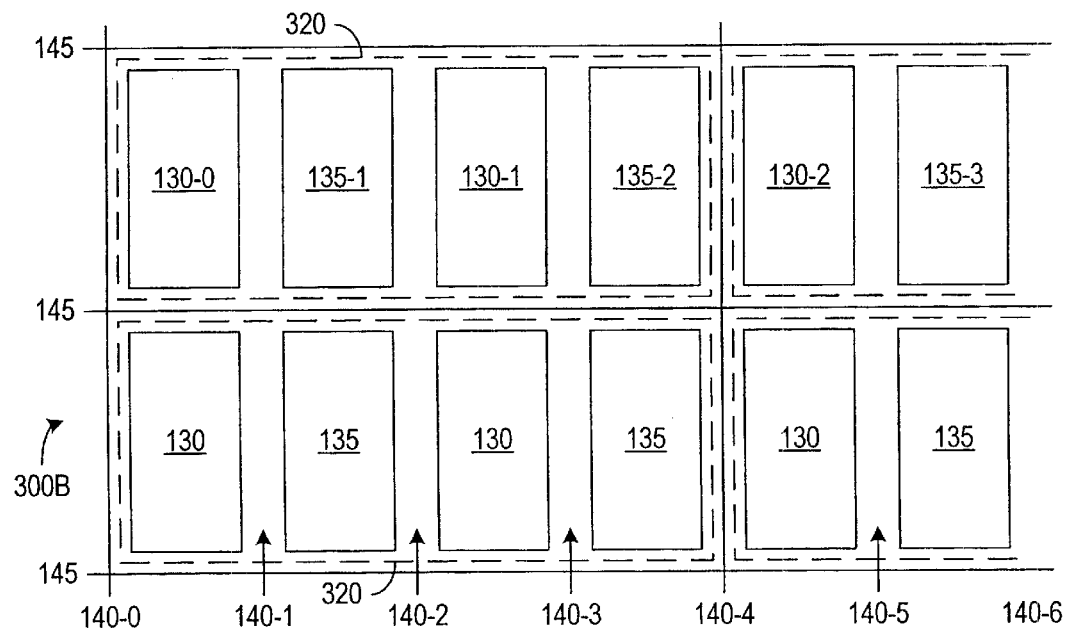

FIGS. 3A and 3B show alternative sawing patterns for separation of finished wafers 300A and 300B into individual chips. Finished wafers 300A and 300B inherit structures from generic wafer 100 including columns of memory units 130 interleaved with columns of memory units 135. Each column is separated from neighboring columns by vertical scribe lanes 140, and horizontal scribe lanes 145 separate rows of interleaved memory units 130 and 135.

FIG. 3A illustrates how finished wafer 300A is sawn or cut to provide memory chips 310 referred to herein as 1x chips. Finished wafer 300A is manufactured from generic wafer 1100 as described herein by forming specialized layers that are specifically for the 1x chips. The sawing pattern of FIG. 3A provides one memory unit 130 and one memory unit 135 in each 1x chip 310.

FIG. 3B shows finished wafer 300B as sawn to provide memory chips 320 referred to herein as 2x chips. Finished wafer 300B is manufactured from generic wafer 100 by forming specialized layers that are specifically for the 2x chips. The sawing pattern of FIG. 3B provides two memory units 130 and two memory units 135 in each 2x chip 320. Accordingly, 2x chips 320 of FIG. 3B have twice the memory capacity of 1x chips of FIG. 3A.

Figure 4A:
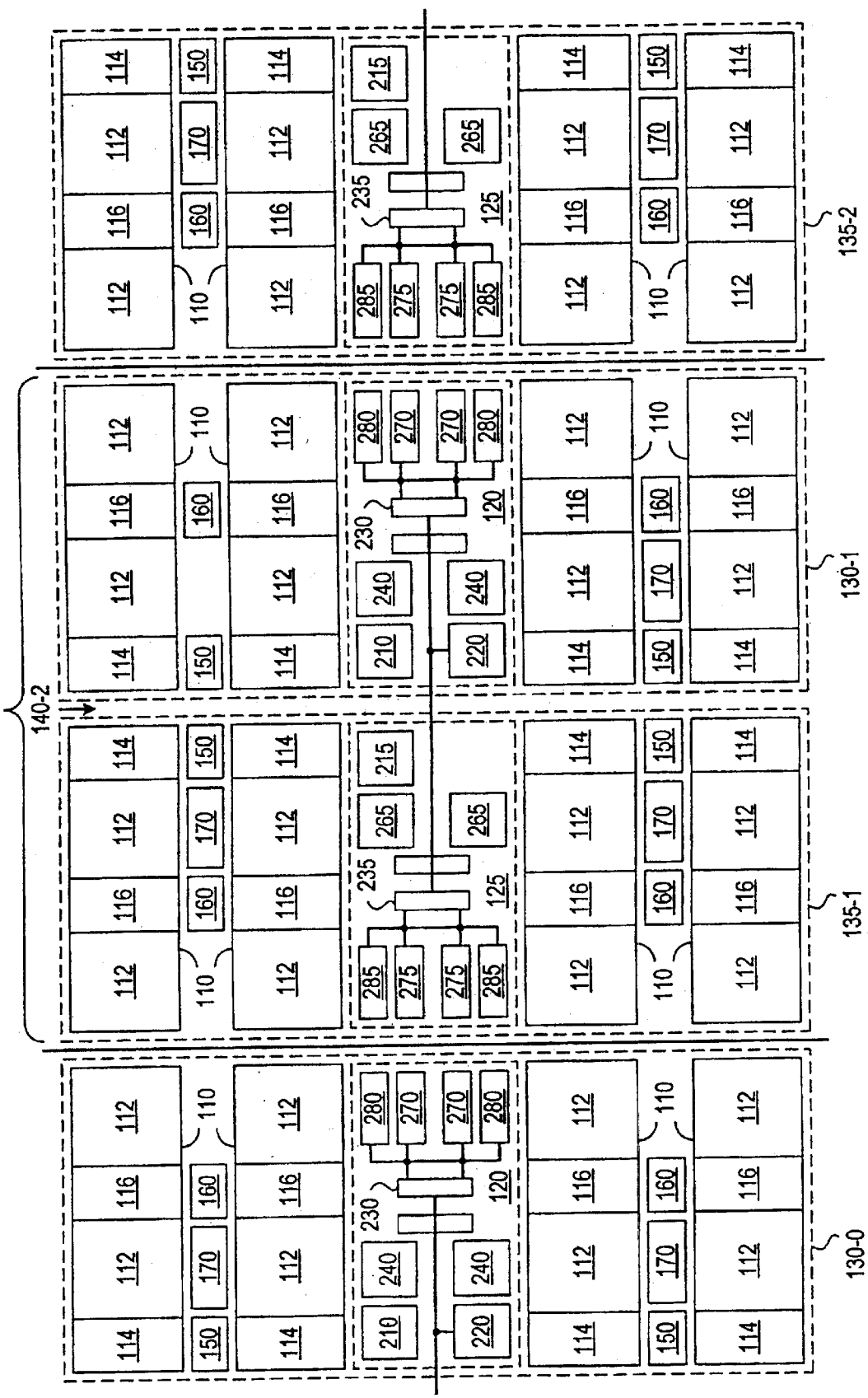
FIGS. 4A and 4B illustrate structures formed in specialized layers on the wafer of FIG. 1 for transmission of clock signals in 1x and 2x memory chips, respectively.

As indicated above, a manufacturing process forms specialized layers on generic wafer 100 to create an interconnect structure according to the memory capacity of the memory chips (1x or 2x) being manufactured. FIG. 4A illustrates a portion of the interconnect structure that is used for clock signals in the 1x chips 310 of FIG. 3A. The interconnect structure connects clock buffer 220 in memory unit 130 to auxiliary clock drivers 230 and 235 in memory units 130 and 135. Accordingly, the interconnect structure crosses a scribe lane 140-2 between memory units 130 and 135.

From auxiliary clock drivers 230 and 235 the clock signal is distributed as required in respective memory units 130 and 135. FIG. 4A illustrates distribution of the clock signals to data I/O circuits 270, 275, 280, and 285, but the clock signal can be further distributed where required in memory units 130 and 135. The connections from auxiliary clock drivers 230 and 235 can be form in the specialized layers or in the generic layers if such connections are common to the different chip configurations.

Figure 4B:
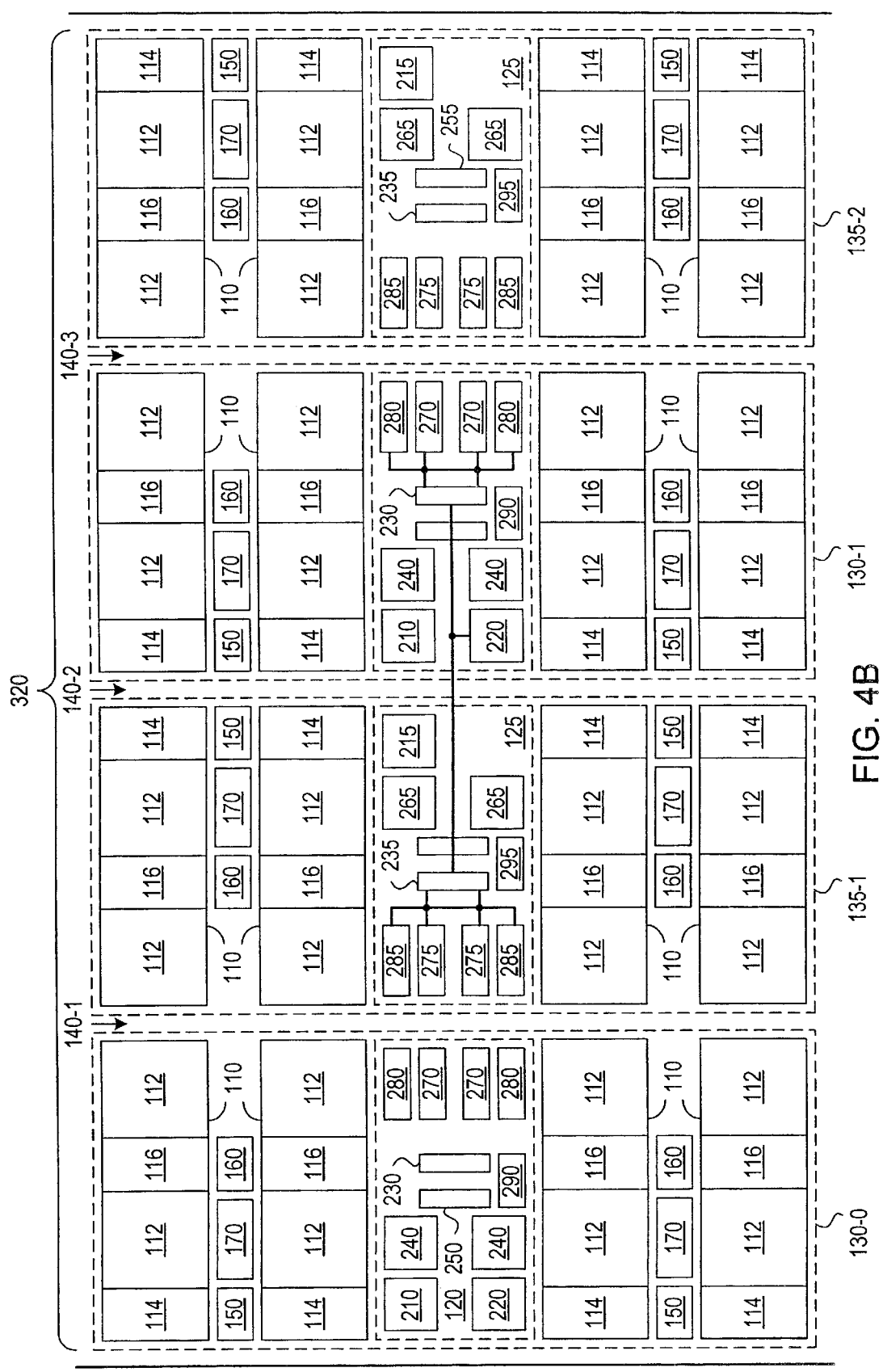

FIG. 4B shows the interconnect structure for clock signals in a 2x chip 320. The 2x chip 320 includes four memory units 130-0, 135-1, 130-1, and 135-2 and has duplicated sets of peripheral circuits 120 and 125. To improve the uniformity of signal transmission times throughout 2x chip 320, the 2x chips generally use circuit blocks in centrally located peripheral circuits 120 and 125 in memory units 130-1 and 135-1. Accordingly, redundant buffers and other circuit blocks in memory units 130-0 and 135-2 are inactive in 2x chip 320, and no signal lines from clock buffer 220 in memory unit 130-1 are connected to the inactive circuit blocks.

Control signals are distributed from control block 210 in a manner similar to the distribution of clock signals from clock buffer 220. Control flags 215 are used to select memory cores 110, and the output signals from control flags 215 are combined with Y address signals at the Y address drivers 160, which are described further below.

Figure 5A:
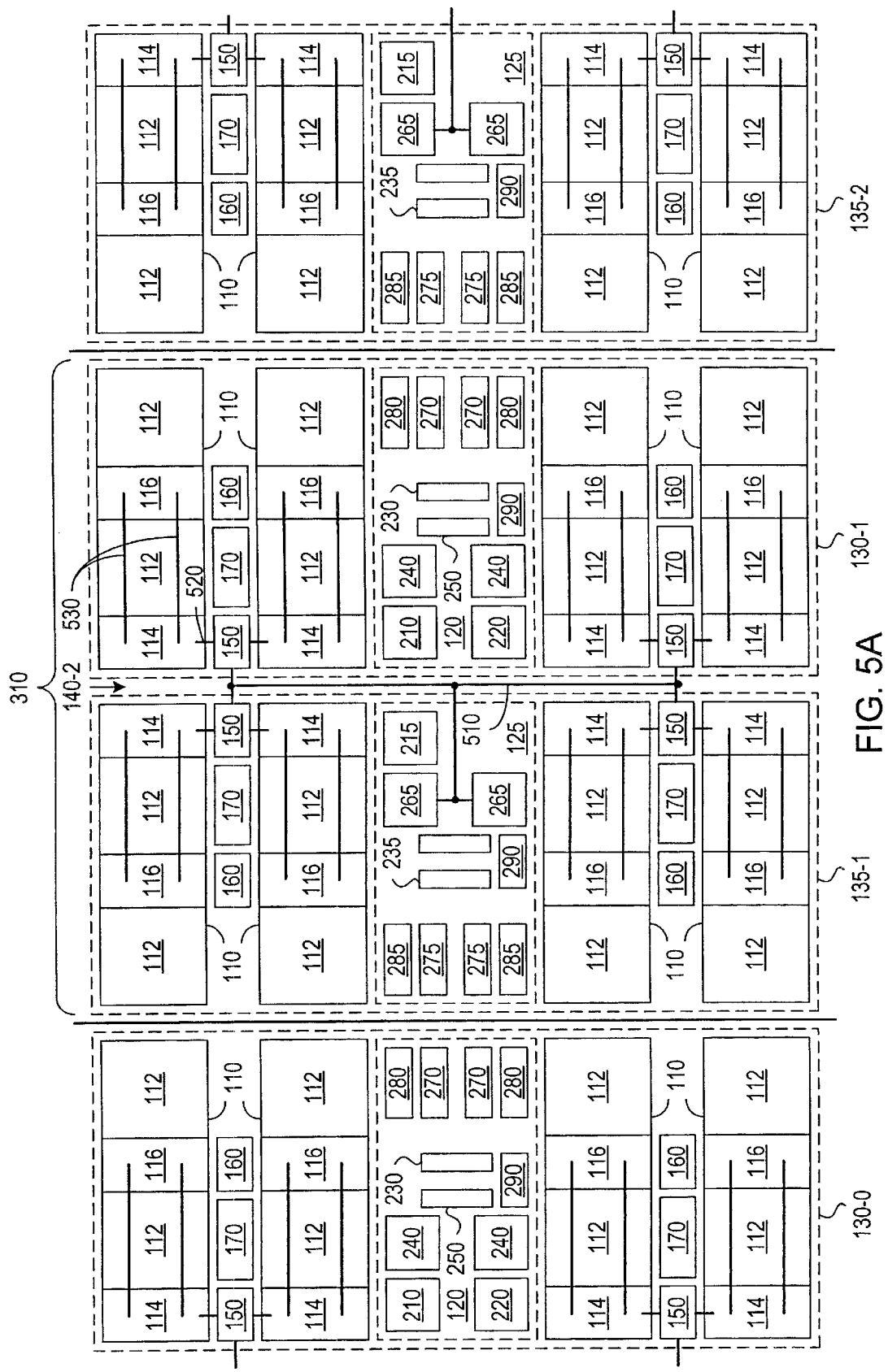
FIGS. 5A and 5B illustrate structures formed in specialized layers on the wafer of FIG. 1 for transmission of row address signals in 1x and 2x memory chips, respectively.

FIG. 5A represents the interconnect structure that connects X address buffers 265 in memory unit 135 to memory cores 110 in 1x chip 310. X address buffers 265 receive and buffer the row or X address signals input to 1x chip 310. To reduce loading on X address buffers 265, 1x chip 310 has two (a lower and an upper) X address buffers 265 that are connected to the same X-address pads (not shown). One or more buses 510, which reside in scribe lane 140-2, are connected to X address buffers 265 and distribute X address signals from X address buffers 265 to X address drivers 150 in memory units 130 and 135. Each X address driver 150 provides pre-decoded address signals to main row decoders 114 in the associated memory cores 110. The interconnect structure also includes lines 530 that connect the main row decoders 114 to associated word line drivers 116, which are connected to word lines in arrays 112.

Figure 5B:
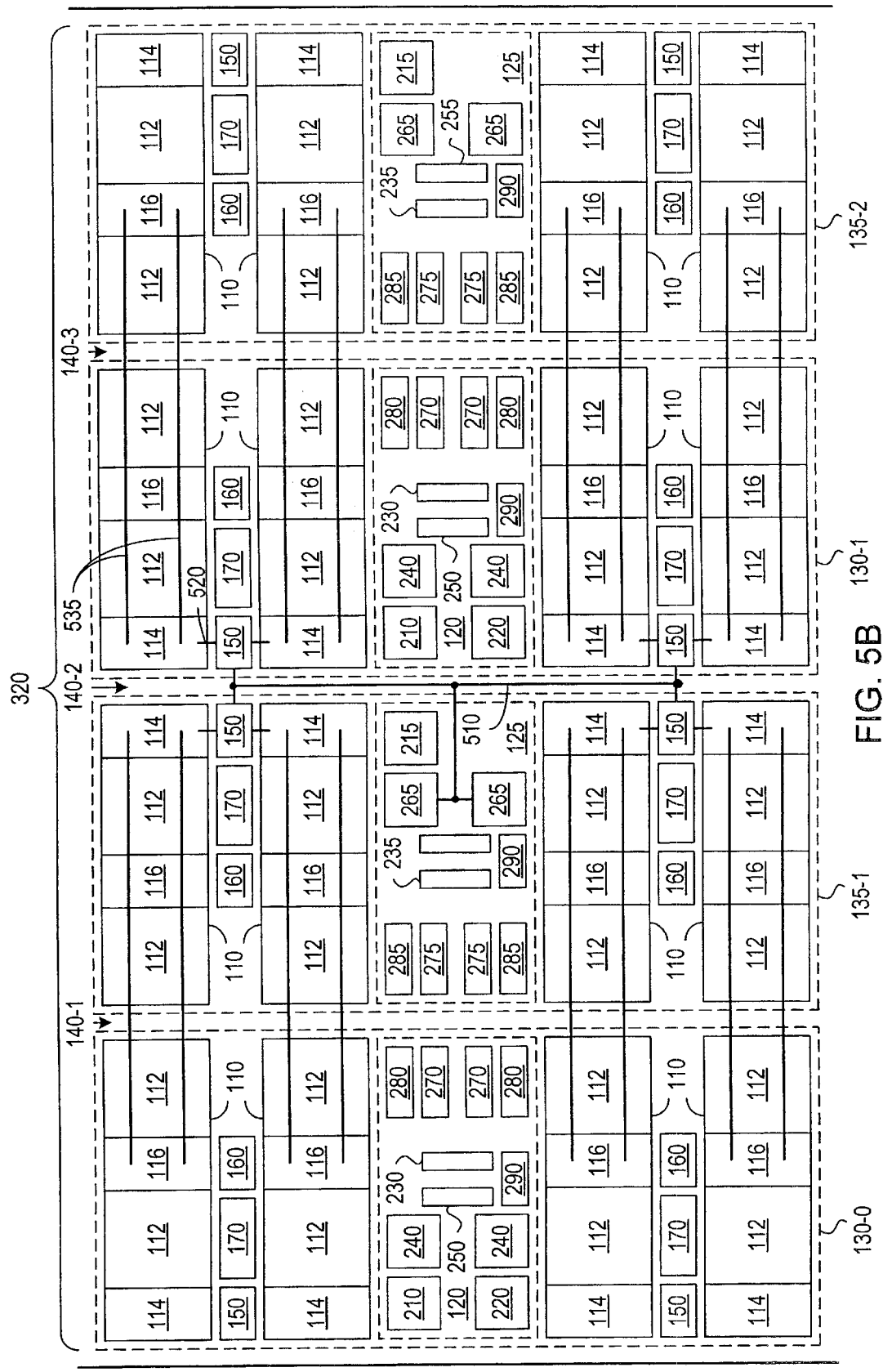

The 2x chip 320 shown in FIG. 5B employs a similar interconnect structure including buses 510 and 520 for distribution of pre-decoded X address signals from X address buffers 265. In 2x chip 320, only the X address buffers 265 in the central memory unit 135-1 are activated. The X address buffers 265 in outer memory unit 135-2 are inactive and disconnected. Additionally, 2x chip 320 has longer lines 535 that connect main row decoders 114 in central memory units 135-1 and 130-1 to word line drivers 116 in memory units 130-0, 135-1, 130-1, and 135-2. Lines 535 for main row decoders 114 in memory unit 130-1 connected to word line drivers 116 in memory units 130-1 and 135-2. Similarly, lines 535 for main row decoders 114 in memory unit 135-1 connected to word line drivers 116 in memory units 135-1 and 130-0. Main row decoders 114 in the outer memory units 130-0 and 135-2 are inactive.

Figure 6A:
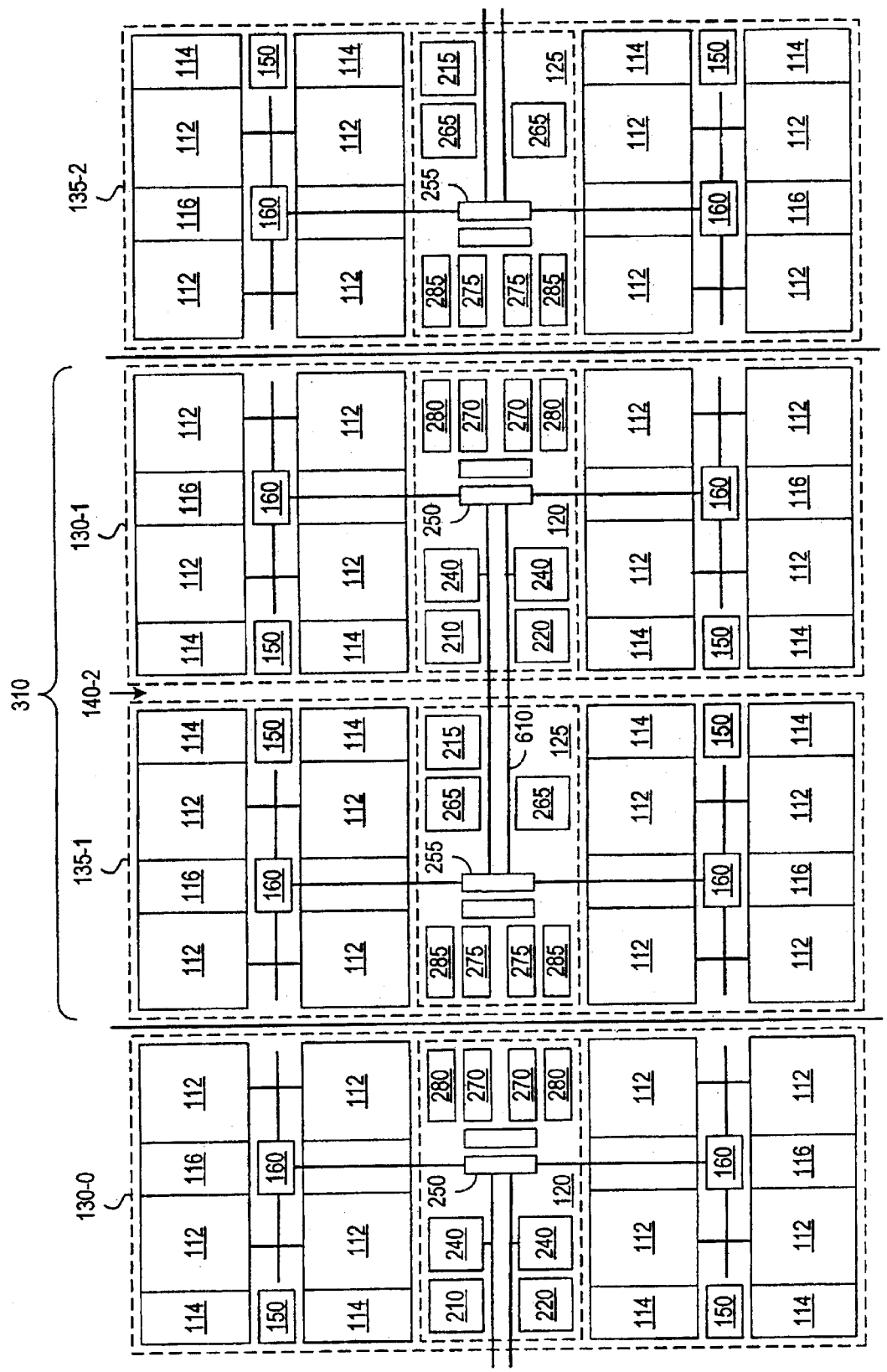
FIGS. 6A and 6B illustrate structures formed in specialized layers on the wafer of FIG. 1 for transmission of column address signals in 1x and 2x memory chips, respectively.
Figure 6B:
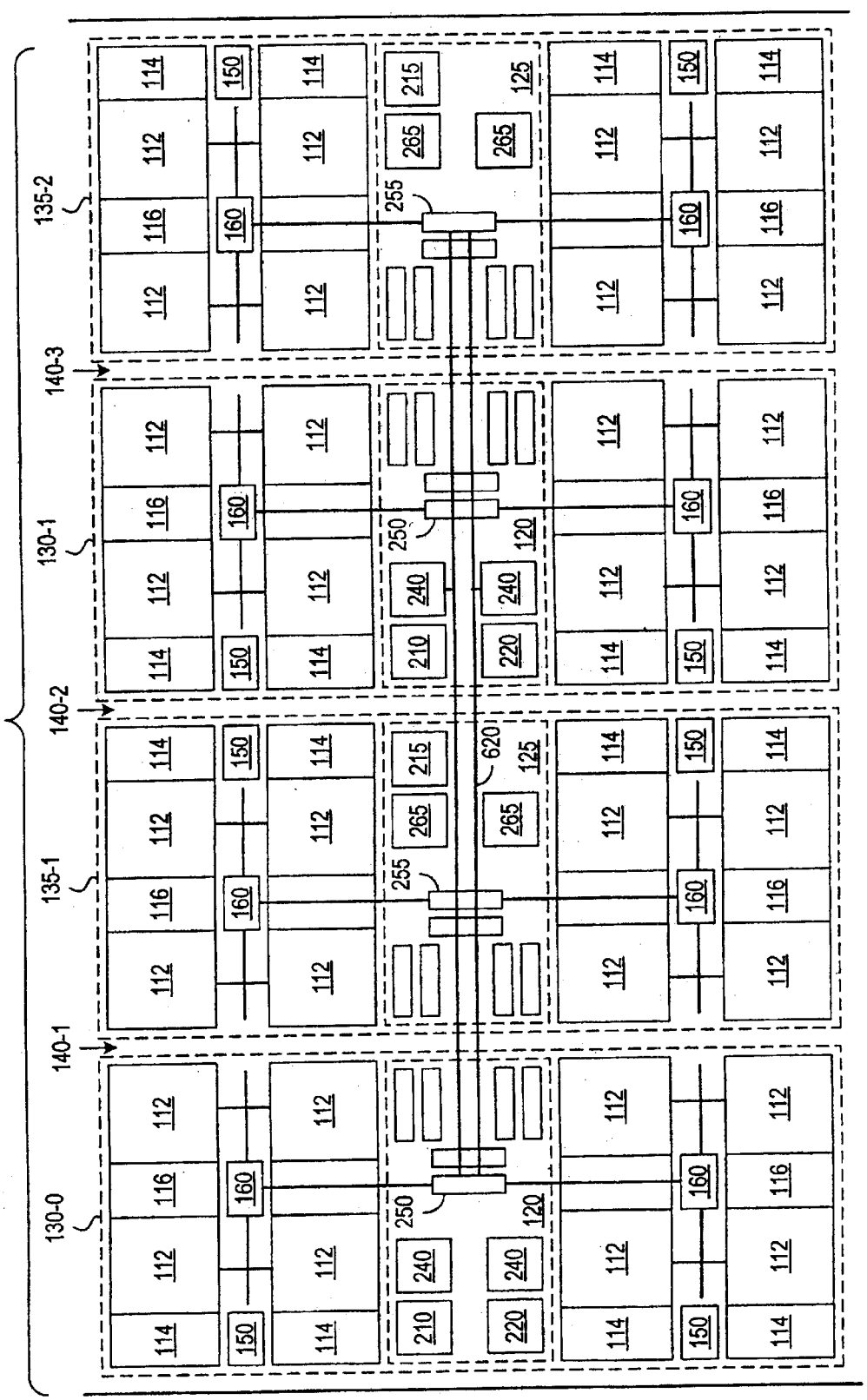

Distribution of Y address signals is from a pair of Y address buffers 240 that are connected to the same Y address pads (not shown). As shown in FIGS. 6A and 6B, the specialized layers create Y address interconnect structures that connect Y address buffers 240 to auxiliary Y address drivers 250 and 255 in peripheral circuits 120 and 125. Accordingly, in the 1x chip 310 of FIG. 6A, lines 610 extend from Y address buffers 240 to auxiliary Y address drivers 250 in memory unit 130-1 and across scribe lane 140-2 to auxiliary Y address drivers 255 in memory unit 135-1. The Y address interconnect structure in the 2x chip 320 of FIG. 6B differs from the Y address interconnect structure in 1x chip 310 in that lines 620 in 2x chip 320 connect Y address buffers 240 in memory unit 130-1 to auxiliary Y address drivers 250 and 255 in four memory units 130-0, 135-1, 130-1, and 135-2. Auxiliary Y address drivers 250 and 255 are connected to Y address drivers 160 in the memory units 130 and 135, which are connected to the main column decoders (not shown) for memory arrays 112. The main column decoders decode pre-decoded signals and activate bit line sense and/or driver circuits (not shown) for access to memory arrays 112.

Y address buffers 240 include buffers for a most significant Y address bit that is used in the 2x chips 320 but not used in the 1x chips 310. In the 1x chips, the extra Y address buffers do not need to be activated or connected to I/O pads. In the 2x chips, an access (e.g., read or write) with the most significant Y address bit having one value (e.g., zero) is an access of memory unit 130-1 or 135-1. An access with the most significant Y address bit having the other value (e.g., one) is an access of memory unit 130-0 or 135-2. Accordingly, in the exemplary embodiment of the 2x chip 320, the MSB of Y address signal being "high", selects memory units 130-0 and 135-2, and the MSB of Y addresses being "low" selects memory units 130-1 and 135-1. The 1x chips 310 do not use the MSB of Y address signal that 2x chips 320 use.

Figure 7A:
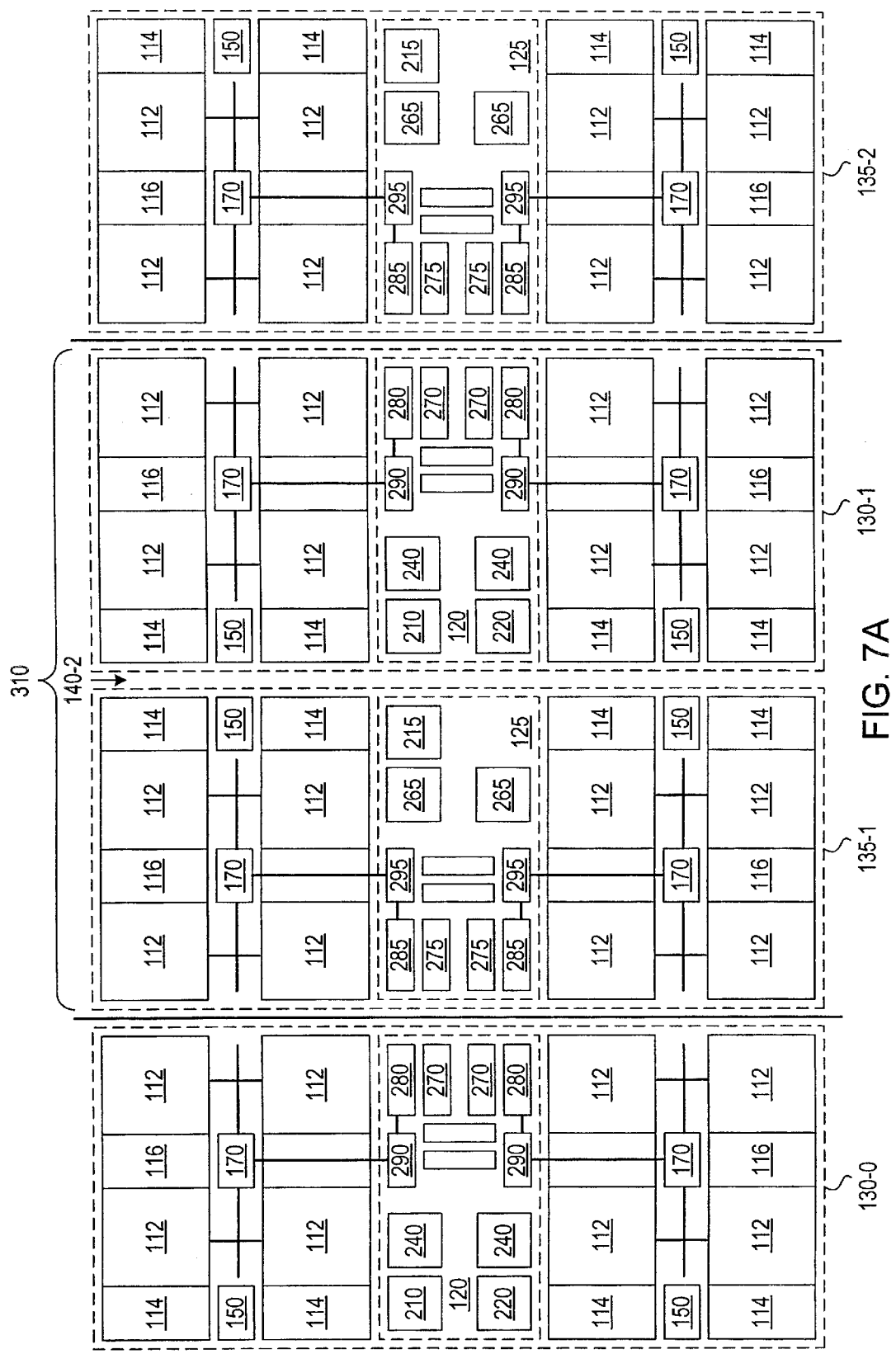
FIGS. 7A and 7B illustrate structures formed in specialized layers on the wafer of FIG. 1 for data input and output in 1x and 2x memory chips, respectively.
Figure 7B:
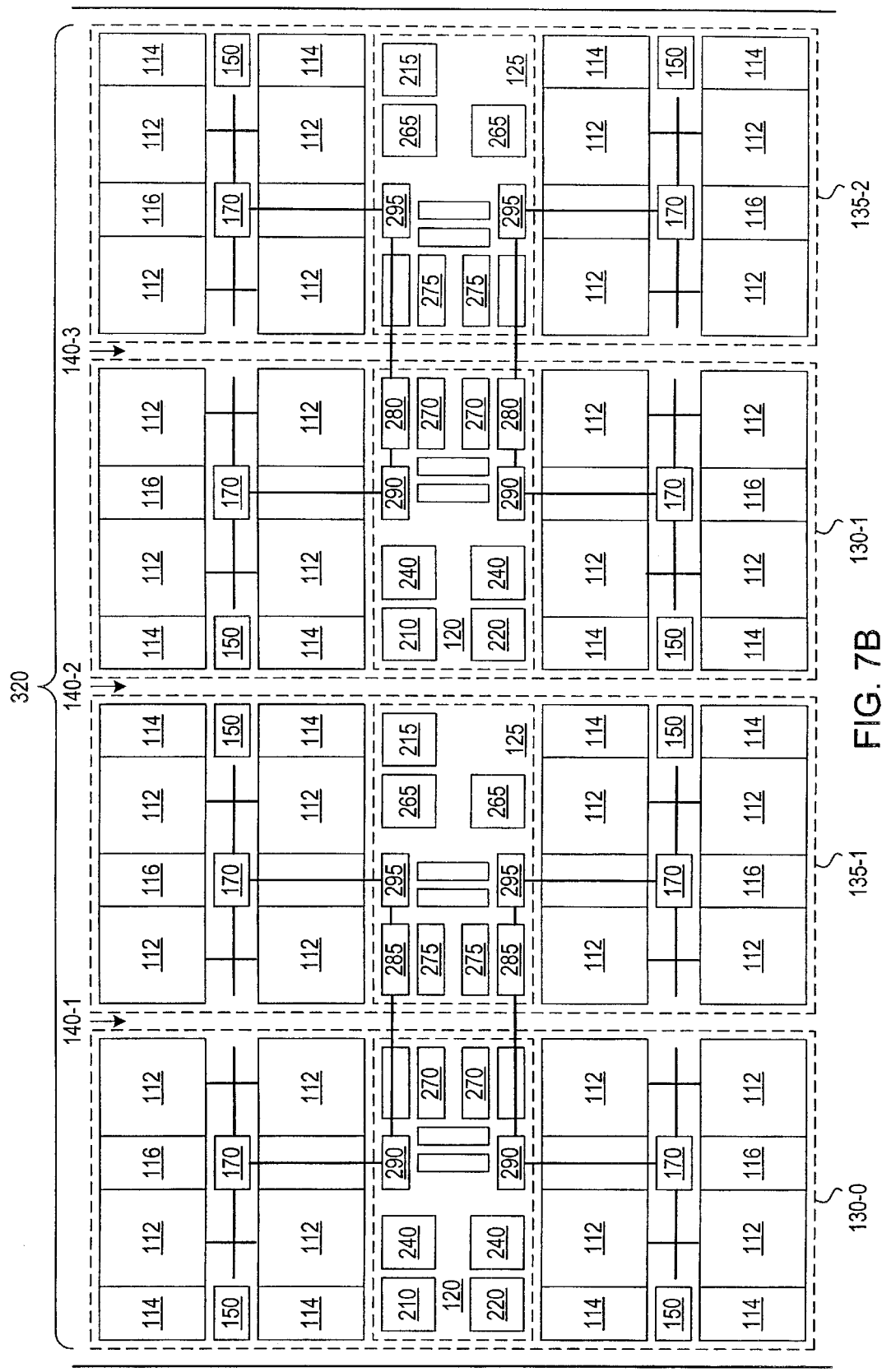

FIGS. 7A and 7B show data I/O lines that connect data buffers 280 and 285 to respective auxiliary data drivers 290 and 295 in respective peripheral circuits 120 and 125 and to data drivers 170 for memory cores 110. For the 1x chip of FIG. 7A, each data I/O line lies entirely within an associated memory unit 130 or 135, and each memory units 130 or 135 is associated with a different set of bits that are read or written in parallel.

For the 2x chip 320 of FIG. 7B, the data lines also connect the data buffers 280 and 285 of the central memory units 130-1 and 135-5 to auxiliary data drivers 295 and 290 in memory units 135-2 and 130-0, respectively. Data input/output through data buffers 280 in memory unit 130-1 is to or from either memory unit 130-1 or memory unit 135-2 depending on the value of the Y address signal. Similarly, data input/output through data buffers 285 in memory unit 135-1 is to or from either memory unit 135-1 or memory unit 130-0 depending on the value of the Y address signal.

The exemplary embodiment described above uses the same number of X address bits and the same number of data bits for both the 1x and 2x chips, but the 2x chips require an additional Y address bit for accessing the additional storage capacity in the 2x chips. Alternatively, both 1x and 2x chips can use the same number of Y address bits and the same number of data bits, while the 2x chips use an additional X address bit to distinguish accesses of memory units 130-1 and 135-1 from accesses of memory units 130-0 and 135-2. Another alternative embodiment employs the same numbers or X and Y address bits for both 1x and 2x chips but doubles the number of data bits in a 2x chip by activating data I/O circuits 270, 275, 280, and 285 in all four memory units in the 2x chip.

As noted above, the specialized layers for different capacity (1x or 2x) memory chips form structures over different scribe lanes. Referring again to FIGS. 3A and 3B, when sawing finished wafer 300A or 300B into separate memory chips 310 or 320, the sawing cuts along all horizontal scribe lanes 145 and selected vertical scribe lanes 140. Referring to FIG. 3A, sawing cuts wafer 300A along odd-numbered scribe lanes 140-1, 140-3, 140-5, and 140-7, but even-numbered scribe lanes 140-2, 140-4, and 140-6 remain intact inside 1x chips. Accordingly, sawing does not disturb the interconnecting structures formed on scribe lane 140-2 for the 1x chips as illustrated in FIGS. 4A, 5A, 6A, and 7A.

The sawing pattern of FIG. 3B only cuts along scribe lanes 140-0 and 140-4, which are used for interconnect structures for 1x chips 310. However, the finished wafer 300B is for fabrication of 2x chips and has the interconnect structures illustrated in FIGS. 4B, 5B, 6B, and 7B, which cross or reside in scribe lanes 140-1, 140-2, and 140-3. Accordingly, the sawing pattern of FIG. 3B does not damage the interconnect structure required for 2x chips 320.

As noted above, peripheral circuits 120 and 125 can be of conventional design according to the type of memory of the IC memory chips. In this case, the characteristics (e.g., the drive capacity) of the peripheral circuits are according to a worst case, e.g., for longest bus lines that arise in specialized layers of memory chip 320 or 310. Alternatively, the specialized layer can activate or configure specific peripheral circuits for operation in a memory chip of the desired size.

In the exemplary embodiment, the disabled clock, X and Y address, and data buffers are in the outside memory units 130-0 and 135-2. The activated buffers in each 1x or 2x chip 310 or 320 are in memory unit 130-1 and 135-1 where the memory unit 130-1 containing activated buffers is to the right of the memory unit 135-1 containing activated buffers. Accordingly, the activated I/O buffers have the approximately same relative configuration in 1x and 2x chips, and bonding pads for buffers activated in a 1x chip 310 can have the same positions as corresponding bonding pads for activated buffers in a 2x chip. The similarity in bonding pad configurations allows similar or identical packaging structures and processes for 1x and 2x chips. The packaging similarities increase the efficiency and flexibility of fabricating memory devices with capacities determined according to commercial demand at the time of completion.

In accordance with another aspect of the invention, memory units 130 and 135 in a single row on wafer 100 are combined to produce a memory chip 310 or 320. This facilitates keeping the bounding pads of the memory chip 310 or 320 along a central axis of the resulting chip. Alternatively, memory units in two or more rows of wafer 100 can be combined on a memory chip, but bonding pads that are above the associated peripheral circuits would be divided into two or more groups.

Neither the sawing pattern of FIG. 3A that produces memory chips 310 nor the sawing pattern of FIG. 3B that produces memory chip 320 cuts scribe lane 140-2. Accordingly, scribe lane 140-2 and similar scribe lanes 140-6 etc. that are not cut could be eliminated or reduced in size to make more area available for active elements of the generic layers. However, if scribe lane 140-2 is eliminated, a 1x memory chip 310 containing memory units 135-1 and 130-1 would be smaller than some similar chips, for example, a 1x memory chip containing memory units 135-2 and 130-2. Scribe lane 140-2, although never cut, provides uniform size and bonding pad patterns for all 1x memory chips formed from wafer 100, and thus simplifies packaging of the memory chips. Scribe lanes 140-2 also facilitate use of step-and-repeat photolithography for patterning of layers of wafer 100.

A step-and-repeat photolithography process conventionally starts by coating photoresist on a layer to be patterned. A mask or reticle is aligned to patterns or marks on the wafer, and light shown through the reticle exposes a pattern on a region of the photoresist. This region is referred to herein as a shot region and conventionally corresponds to one or more chip. After exposure of one shot region, the wafer is moved relative to the reticle, and the alignment and exposure steps are repeated to expose another shot region. The exposure process is repeated until shot regions cover the entire wafer. After exposing the entire wafer, the photoresist is developed to remove either the exposed or unexposed photoresist depending on the type of photoresist employed. The process then ashes and cleans the remaining photoresist, and an etching process patterns the underlying layer by removing the portions of the underlying layer that the photoresist pattern exposes.

A shot region for fabrication of a generic wafer 100 in accordance with the invention preferably covers one or more pairs of memory units 130 and 135. Since the boundaries of each chip is not known until after selection of the size of the memory chips, some chips may include memory units from different shot regions. When forming the specialized layers, the boundaries of the chip are known, and the manufacturer can select the shot region to correspond to the area of one or more full chips.

Figure 8:
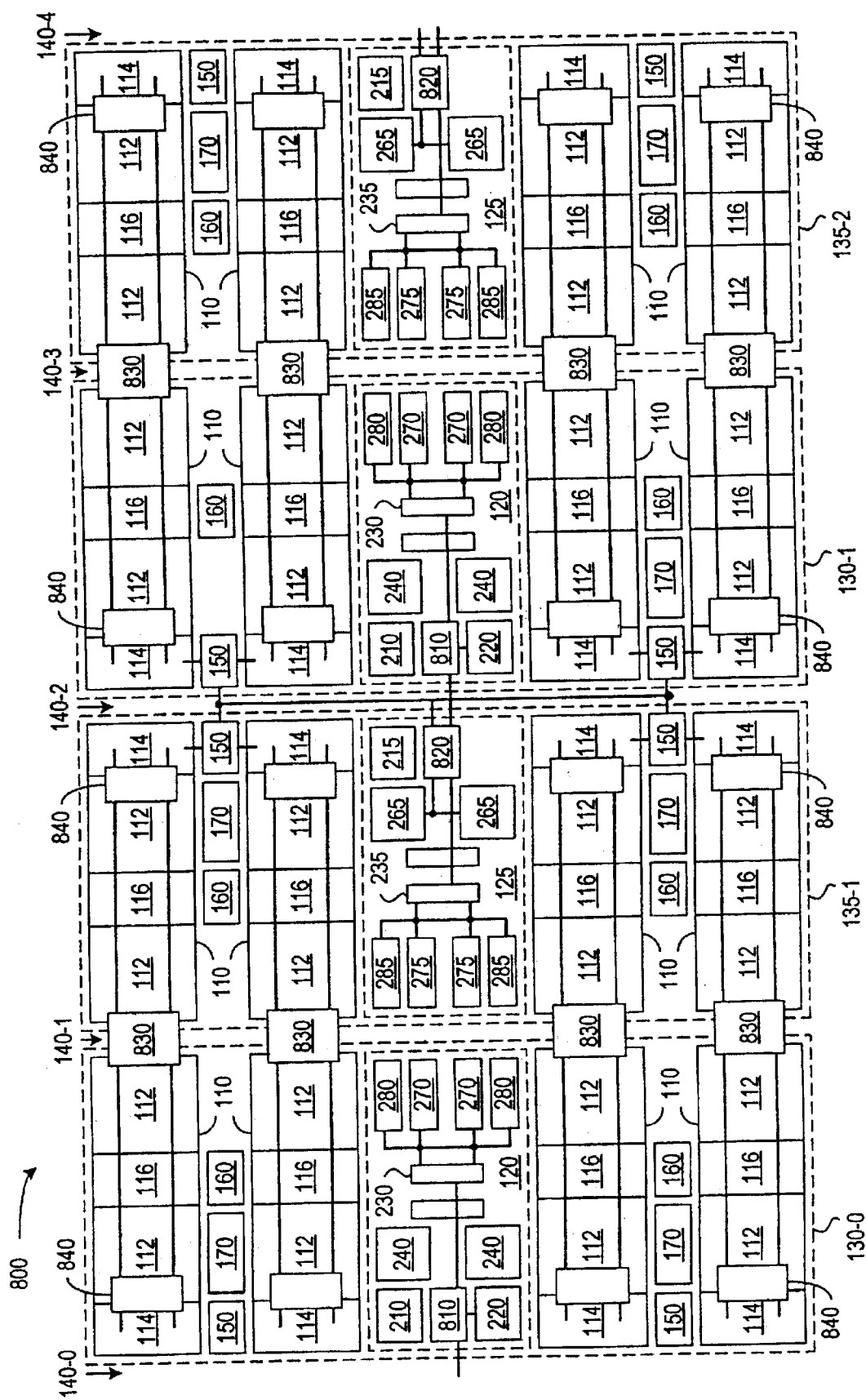
FIG. 8 shows a portion of a semiconductor wafer after fabrication forms generic layers including fuses for integrated circuit memory devices having different storage capacities.

FIG. 8 shows a generic wafer 800 that can be fabricated by further processing of generic wafer 100 to add interconnect structures for clock and X address signals. The interconnect structures are similar to those described above in regard to FIGS. 4A, 4B, 5A, and 5B except that the interconnect structures in wafer 800 further include fuses 810, 820, 830, and 840. Before separating wafer 800 into 1x or 2x memory chips, fuses 810, 820, 830, and 840 are selectively cut or left intact according to the desired size of memory chips.

For 1x memory chips, fuses 810 and 820 remain intact, and the interconnect structure of wafer 800 distributes clock signals in the same manner as the interconnect structure of FIG. 4A. For distribution of X address signals in the 1x chips, fuses 840 are left intact, but fuses 830 are cut so that the interconnect structure distributes X address signals in the same manner as the interconnect structure of FIG. 5A. In the embodiment of FIG. 8, fuses 830 reside in scribe lanes 140-1 and 140-3 and can be cut as a result of the separation of 1x chips according to the sawing pattern of FIG. 3A.

Manufacturing 2x memory chips requires cutting of fuses 810 and 820 in memory unit 130-0 and 135-2 to disconnect and disable clock buffer 220 and clock driver 230 in memory unit 130-0 and to disconnect and disable X address buffers 265 and clock driver 235 in memory unit 135-2. Additionally, fuses 840 are cut to disable main row decoders 114 in memory units 130-0 and 135-2. Fuses 830 are left intact so that main row decoders 114 in memory units 135-1, 130-1, and 135-2.

More generally, fuses (or anti-fuses) can be added to interconnect structures such as described in regard to FIGS. 4A, 4B, 5A, 5B, 6A, 6B, 7A, and 7B to provide fuse options for fabrication of 1x or 2x memory chips. Any combination or all of such interconnect structures can be implemented in the generic wafer. A generic wafer including the interconnect structure with fuse options can be finished by selectively cutting or leaving intact particular fuses and adding specialized layer (if any are required) according to whether 1x or 2x memory chips are desired.

Embodiments of this invention are not limited to memory devices of just two sizes. Those of ordinary skill in the art will appreciate that embodiments of this invention can provide memory chips with storage capacity three or more times greater than the storage capacity of 1x memory chip 310. For example, a 3x memory chip can include six memory units 130 and 135 with appropriate interconnect structures. Additionally, although a linear array of the memory units advantageously facilitates placement of bonding pads along a central axis, other embodiments of the invention can use memory units from one or more rows on a wafer.

Although the invention has been described with reference to particular embodiments, the description is only an example of the invention's application and should not be taken as a limitation. In particular, even though much of preceding discussion was aimed at DRAM, alternative embodiments of this invention include SRAM and flash memory. Also, each individual generic wafer can provide integrated circuit memory chips that all have the same storage capacity or of different storage capacities. Various other adaptations and combinations of features of the embodiments disclosed are within the scope of the invention as defined by the following claims.

We claim:

1. A wafer containing integrated circuit structures, comprising:

scribe lanes; and a plurality of memory units that are separated by the scribe lanes, the memory units being such that forming a conductive structure on a set of the memory units and at least one scribe lane, and cutting the wafer along the scribe lanes surrounding the set of memory units forms a complete memory chip, wherein:

the set of memory units includes a first memory unit a second memory unit with each of the first and second memory units comprising active circuit elements, the complete memory chip includes the first memory unit, the second memory unit, and the scribe lane that is between the first memory unit and the second memory unit; and the conductive structure crosses the scribe lane to connect active circuit elements in the first memory unit to active circuit elements in the second memory unit, wherein the scribe lanes comprise dummy scribe lanes that remain uncut when separating the wafer into memory chips.

2. The wafer of claim 1, further comprising a fuse structure that includes a first fuse option in the memory units and a second fuse option in one of the scribe lanes.

3. The wafer of claim 2, wherein the second fuse option of the fuse structure extends across one or more of the scribe lanes to thereby interconnect two or more of the memory units.

4. The wafer of claim 2, wherein in the complete memory chip, the first fuse option remains intact and the second fuse option is cut.

5. The wafer of claim 1, wherein the dummy scribe lanes are sized such that when separating the wafer into memory chips of the same storage capacity, each of the memory chips has the same size.

6. A wafer containing integrated circuit structures, comprising:

scribe lanes; and a plurality of memory units that are separated by the scribe lanes, the memory units being such that forming a conductive structure on a set of the memory units and at least one scribe lane, and cutting the wafer along the scribe lanes surrounding the set of memory units forms a complete memory chip, wherein:
the set of memory units includes a first memory unit and a second memory unit with each of the first and second memory units comprising active circuit elements,
the complete memory chip includes the first memory unit, the second memory unit, and the scribe lane that is between the first memory unit and the second memory unit;
the conductive structure crosses the scribe lane to connect active circuit elements in the first memory unit to active circuit elements in the second memory unit;
the memory units are such that forming a second conductive structure on a second set of the memory units and at least one scribe lane, and cutting the wafer along the scribe lanes surrounding the second set of memory units forms a second complete memory chip having a storage capacity that differs from the complete memory chip formed by cutting around the first-recited set of memory units;
the second set of the memory units includes the first memory unit, the second memory unit, a third memory unit, and a fourth memory unit with each of the first, second, third, and fourth memory units comprising active circuit elements;
the second complete memory chip comprises the first, second, third, and fourth memory units and a plurality of the scribe lanes that are between any two of the first, second, third, and fourth memory units;
the first memory unit structurally differs from the second memory unit and is structurally the same as the fourth memory unit;
the second memory unit is structurally the same as the third memory unit; and
the conductive structure crosses the scribe lanes in the complete chip to connect active circuit elements in one memory unit to active circuit elements in another memory unit.

7. A wafer containing integrated circuit structures comprising:
scribe lanes; and
a plurality of memory units that are separated by the scribe lanes, the memory units being such that forming a conductive structure on a set of the memory units and at least one scribe lane, and cutting the wafer along the scribe lanes surrounding the set of memory units forms a complete memory chip, wherein:
the set of the memory units includes a first memory unit, a second memory unit, a third memory unit, and a fourth memory unit with each of the first, second, third, and fourth memory units comprising active circuit elements;
the complete memory chip comprises the first, second, third, and fourth memory units and each of the scribe lanes that is between any two of the first, second, third, and fourth memory units;
the first memory unit structurally differs from the second memory unit and is structurally the same as the third memory unit;
the second memory unit is structurally the same as the fourth memory unit; and
the conductive structure crosses the scribe lanes to connect active circuit elements in one memory unit to active circuit elements in another memory unit.

8. The wafer of claim 7, wherein the scribe lanes comprise dummy scribe lanes that remain uncut when separating the wafer into memory chips.

9. The wafer of claim 8, wherein the dummy scribe lanes are sized such that when separating the wafer into memory chips, each of the memory chips has the same size.

10. An integrated circuit memory chip, comprising:
a semiconductor substrate and a plurality of layers disposed on the semiconductor substrate to form a first memory unit and a second memory unit, wherein the first memory unit structurally differs from the second memory unit;
a scribe lane that is intact within the integrated circuit memory chip and between the first and second memory units, the scribe lane corresponding to a region of the substrate and the plurality of layers that lacks active circuit elements, wherein the scribe lane has a width sufficient for a wafer cutting process that separated the integrated circuit memory chip from other integrated memory chips formed in a wafer; and
an interconnect structure that connects the first memory unit to the second memory unit and crosses the scribe lane,
wherein the interconnect structure comprises a fuse structure overlying the plurality of layers.

11. The integrated circuit memory chip of claim 10, further comprising a cut scribe lane at a boundary of the integrated circuit memory chip, wherein the fuse structure includes a cut fuse that prevents electrical connection at the cut scribe lane.

12. The integrated circuit memory chip of claim 10, further comprising a cut scribe lane at a boundary of the integrated circuit memory chip.

13. The integrated circuit memory chip of claim 12, wherein the interconnect structure includes a portion that is cut where the cut scribe lane is cut.

14. The integrated circuit memory chip of claim 12, wherein the cut scribe lane has a length that is the same as that of the scribe lane that is intact.

15. The integrated circuit memory chip of claim 10, wherein:
the first memory unit comprises a Y address buffer connected to receive external Y address signals and lacks an X address buffer; and
the second memory unit comprises an X address buffer connected to receive X address signals and lacks a Y address buffer.

16. The integrated circuit memory chip of claim 10, wherein:
the first memory unit comprises a clock buffer connected to receive an external clock signal;
the second memory unit lacks a clock buffer and comprises a clock driver; and
the interconnect structure connects the clock driver to the clock buffer.

17. The integrated circuit memory chip of claim 10, wherein:
the first memory unit comprises a first data buffer connected for data input to and output from memory cells in the first memory unit; and
the second memory unit comprises a second data buffer connected for data input to and output from memory cells in the second memory unit.

18. The integrated circuit memory chip of claim 10, wherein the semiconductor substrate and the plurality of layers disposed on the semiconductor substrate further form a third memory unit and a fourth memory unit, and wherein the integrated circuit memory chip further comprises:

a second scribe lane that is intact within the integrated circuit memory chip and between the first and third memory units, the second scribe lane corresponding to a second region of the substrate and the plurality of layers that lacks active circuit elements, wherein the second scribe lane has the width sufficient for the wafer cutting process;

a third scribe lane that is intact within the integrated circuit memory chip and between the second and fourth memory units, the third scribe lane corresponding to a third region of the substrate and the plurality of layers that lacks active circuit elements, wherein the third scribe lane has the width sufficient for the wafer cutting process;

a second interconnect structure that connects the first memory unit to the third memory unit and crosses the second scribe lane; and a third interconnect structure that connects the second memory unit to the fourth memory unit and crosses the third scribe lane.

19. The integrated circuit memory chip of claim 18, wherein:

the third memory unit is structurally the same as the second memory unit and structurally different from the first memory unit; and the fourth memory unit is structurally the same as the first memory unit.

20. A memory device comprising:

a plurality of scribe lanes;

a first memory unit that comprises a plurality of memory cell arrays and first active circuit elements;

a second memory unit that comprises a plurality of memory cell arrays and second active circuit elements, wherein the first active circuit elements in the first memory unit differ from the second active circuit elements in the second memory unit, and one of the scribe lanes separates the first memory unit from the second memory unit; and a conductive layer that crosses the scribe lane between the first and second memory units to connect the first active circuit elements in the first memory unit to the second active circuit elements in the second memory unit.

21. The memory device of claim 20, further comprising:

a third memory unit that comprises a plurality of memory cell arrays and third active circuit elements; and a fourth memory unit that comprises a plurality of memory cell arrays and fourth active circuit elements, wherein:

three of scribe lanes respectively separate the first memory unit from the second memory unit, the second memory unit from the third memory unit, and the third memory unit from the fourth memory unit;

the first active circuit elements are the same as the third active circuit elements;

the second active circuit elements are the same as the fourth active circuit elements; and the first and third active circuit elements differ from the second and fourth active circuit elements.

22. A method for manufacturing an integrated circuit memory, comprising:

processing a wafer to form a plurality of memory units;

forming a conductive structure on the memory units, wherein the conductive structure corresponds to a desired storage capacity and is one of a plurality of alternative conductive structures for the memory units, each of the alternative conductive structures corresponding to a different one of the plurality of storage densities, wherein the conductive structure and alternative conductive structures are patterned metal layers; and separating the wafer into semiconductor chips using a sawing pattern that corresponds to the desired storage capacity, the sawing pattern being one of a plurality of alternative sawing patterns, each of the alternative sawing patterns corresponding to a different one of the plurality of storage densities.

23. The method of claim 22, wherein:

the plurality of memory units includes a row of memory units that are separated by a sequence of scribe lanes;

a first of the alternative sawing pattern cuts along every other one of the scribe lanes beginning with a scribe lane that is first in the sequence; and a second of the alternative sawing patterns cuts along every fourth of the scribe lanes beginning with a scribe lane that is second in the sequence.

24. The method of claim 22, wherein said separating further includes:

sawing along a sequence of scribe lanes that separate the memory units, whenever at least one of the scribe lanes remains uncut after separating the wafer into semiconductor chips.

25. A method for manufacturing an integrated circuit memory, comprising:

processing a wafer to form a plurality of memory units;

forming on the memory units a conductive structure that interconnects the memory units and includes fuses that provide a plurality of fuse options, wherein the plurality of fuse options respective correspond to a plurality of storage capacities, and are located in a scribe lane;

cutting fuses to achieve the fuse option corresponding to a desired memory capacity that is selected from the plurality of storage capacities; and separating the wafer into semiconductor chips using a sawing pattern that corresponds to the desired storage capacity, the sawing pattern being one of a plurality of alternative sawing patterns respectively corresponding to the plurality of storage densities.

26. The method of claim 25, wherein:

the plurality of memory units includes a row of memory units that are separated by a sequence of scribe lanes;

a first of the alternative sawing pattern cuts along every other one of the scribe lanes beginning with a scribe lane that is first in the sequence; and a second of the alternative sawing patterns cuts along every fourth of the scribe lanes beginning with a scribe lane that is second in the sequence.

* * * * *